(12) United States Patent
Jorgenson et al.

(10) Patent No.: US 7,312,646 B2
(45) Date of Patent: Dec. 25, 2007

(54) METHOD AND APPARATUS FOR CONTROLLING SWITCHING TRANSIENTS

(75) Inventors: Joel A. Jorgenson, Fargo, ND (US); Bradley R. Thurow, Fargo, ND (US); Brian M. Morlock, Fargo, ND (US)

(73) Assignee: Packet Digital, Fargo, ND (US)

( * ) Notice: Subject to any disclaimer, the term of this patent is extended or adjusted under 35 U.S.C. 154(b) by 223 days.

(21) Appl. No.: 11/128,631

(22) Filed: May 13, 2005

(65) Prior Publication Data
US 2006/0273829 A1 Dec. 7, 2006

(51) Int. Cl.
*H03K 5/12* (2006.01)
(52) U.S. Cl. ...................................... 327/170; 327/551
(58) Field of Classification Search ................ 327/170, 327/551, 558
See application file for complete search history.

(56) References Cited

U.S. PATENT DOCUMENTS

| | | | |
|---|---|---|---|
| 6,421,256 B1 | 7/2002 | Giannopoulos et al. | |
| 6,697,683 B1 * | 2/2004 | Tisue | 700/56 |
| 6,804,091 B2 | 10/2004 | Jenkins et al. | |
| 6,815,996 B1 * | 11/2004 | Hsiao | 327/337 |
| 6,853,227 B2 * | 2/2005 | Laletin | 327/175 |
| 6,897,689 B2 * | 5/2005 | La Rosa | 327/143 |

OTHER PUBLICATIONS

International Search Report from International Searching Authority, International Application No. PCT/US06/11401, International filing date Mar. 28, 2006, mailed Apr. 25, 2007, 3 pages.

\* cited by examiner

*Primary Examiner*—Kenneth B. Wells
(74) *Attorney, Agent, or Firm*—Blakely, Sokoloff, Taylor & Zafman, LLP

(57) ABSTRACT

An apparatus for controlling switching transients including a bus interface unit and a waveform shaper coupled to the bus interface unit and a peripheral device. The bus interface unit generates a number of control signals defining the beginning and end of an operation, where each control signal includes a transition from a first value to a second value over a period of time. The bus interface unit selects a critical control signal defined as the last control signal to start the operation and/or the first control signal to end the operation. The waveform shaper receives the selected control signal and modifies the control signal by increasing the period of time of the transition. The modified control signal is received by the peripheral device and a switching transient in the peripheral device is controlled.

22 Claims, 18 Drawing Sheets

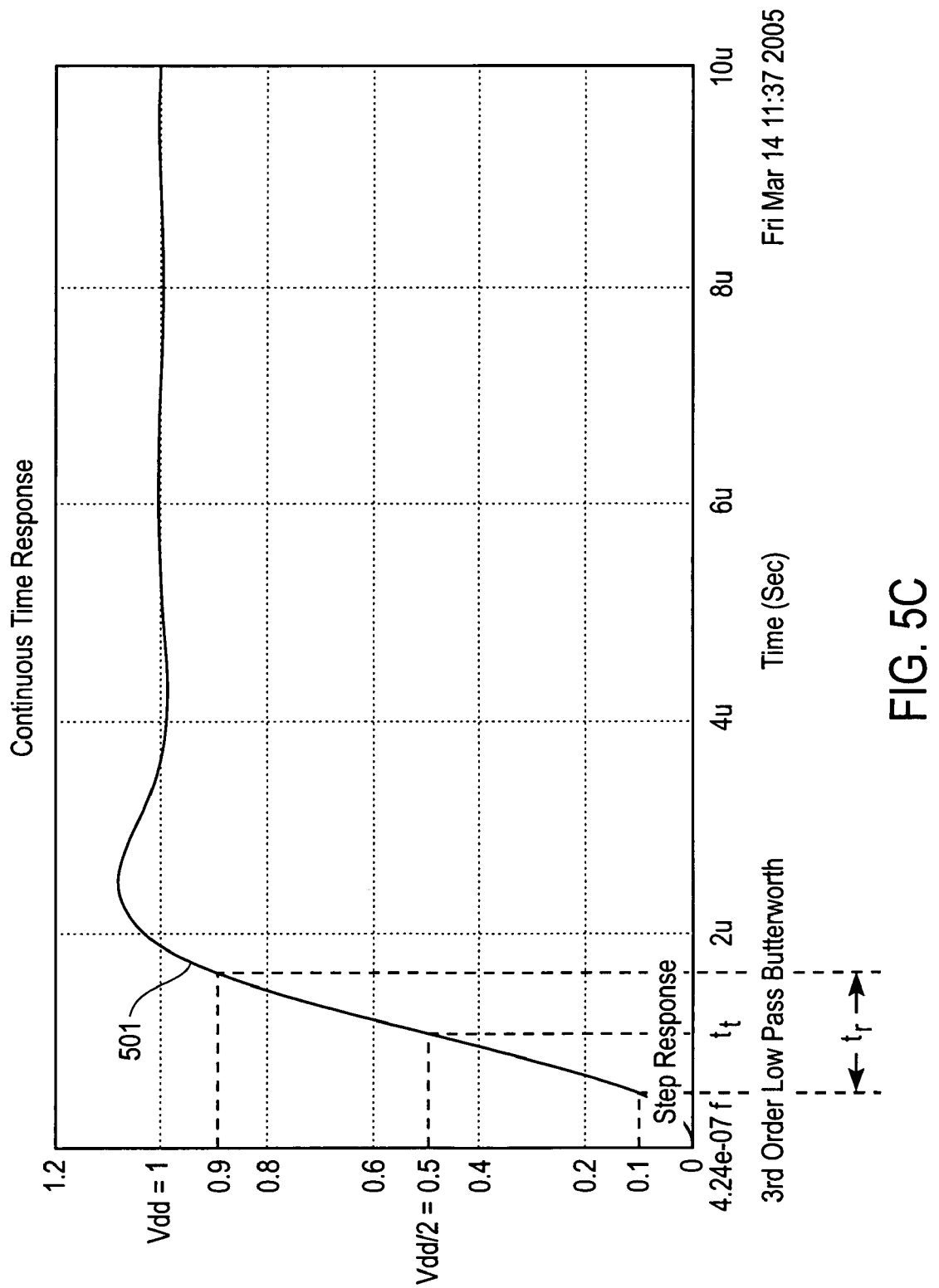

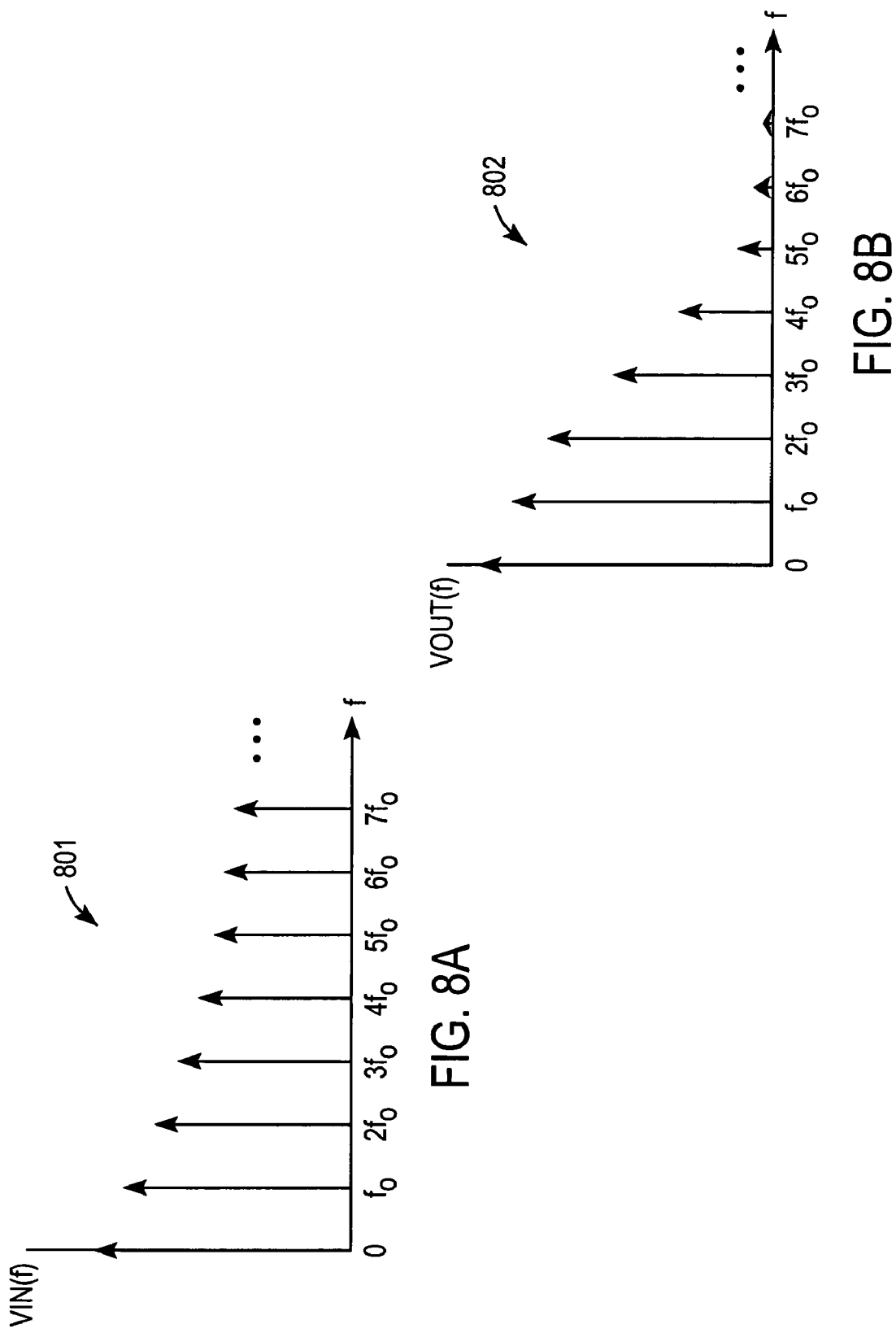

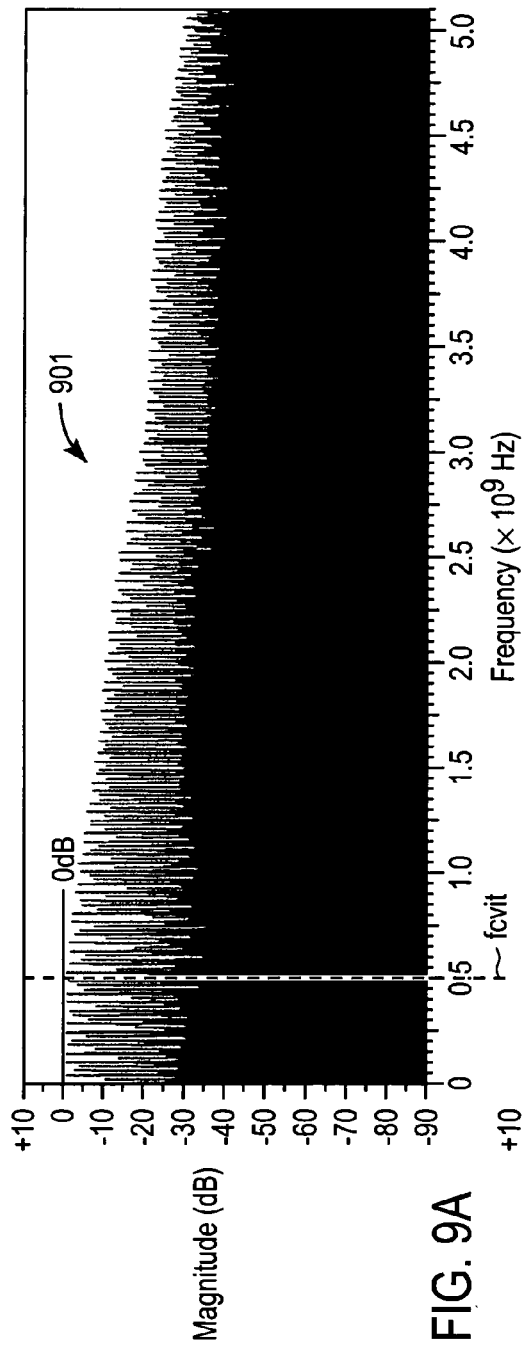
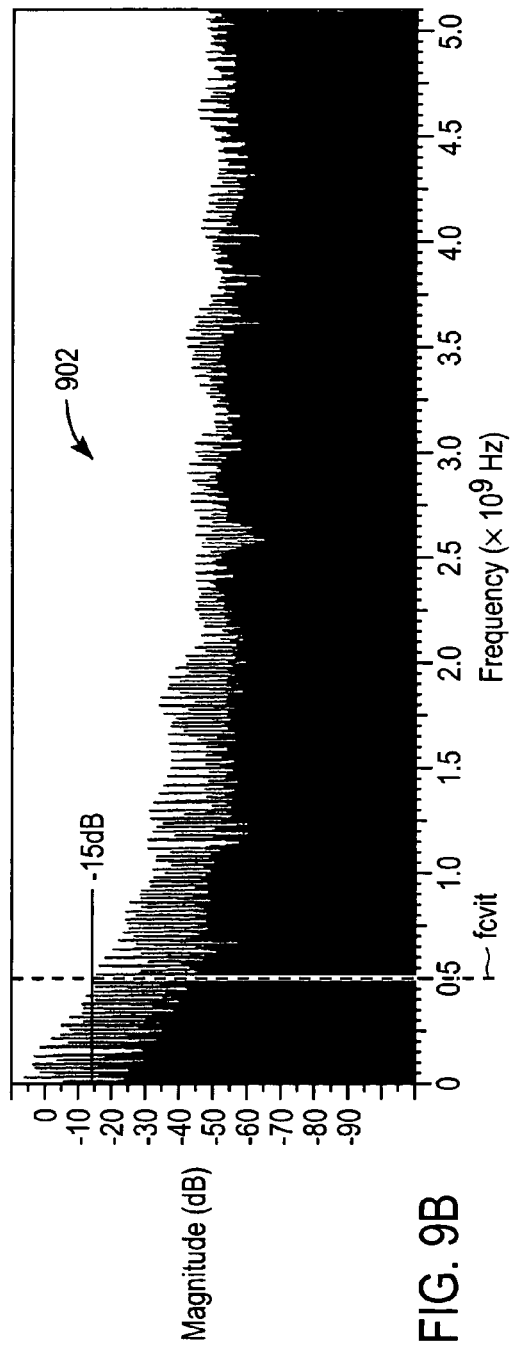
FIG. 9A
FIG. 9B

METHOD AND APPARATUS FOR CONTROLLING SWITCHING TRANSIENTS

TECHNICAL FIELD

Embodiments of the invention relate generally to power management and, in particular, to controlling transient current peaks in digital processing systems.

BACKGROUND

Digital processing systems are constantly evolving toward smaller size, higher operating clock frequencies to improve performance, and lower operating voltages to limit power consumption. However, because power consumption is proportional to the square of the operating frequency and directly proportional to the operating voltage, the total power consumption of a given system tends to increase, or remain constant at best, as performance increases. Power consumption is the product of voltage and current, so as the voltage is reduced, the current required by these systems may increase. With miniaturization, the increase in current in a decreased form factor significantly increases the current density. Furthermore, because the processing systems are operating at higher frequencies and higher edge rates, the high frequency content of their transient current requirements is also increasing. For example, a digital signal with a 200 MHz fundamental frequency may require currents at the seventh harmonic (1.4 GHz), eighth harmonic (1.6 GHz) or higher, to support the associated edge rates.

In a conventional digital processing system, there are many signals that contribute to the high-frequency transient current requirements. For example, there may be signals that transition a device from a standby state to an active state, or vice versa. There may also be control signals or groups of control signals that perform discrete operations such as read or write operations. Typically, each operation (e.g., a read operation or a write operation) requires a combination of synchronous and/or asynchronous control signals in order to execute properly. For example, a memory write operation may require a clock signal, an address strobe signal, a data strobe signal, a chip enable signal and a write enable signal, each signal characterized by fast rising and falling edge transitions. Similarly, a memory read operation may require a clock signal, an address strobe signal, a chip enable signal and an output enable signal. Each of these high edge-rate signals is applied to one or more logic gates, which draw high-frequency transient currents in response to the high edge rates.

The transient currents are supplied by a power supply system, which typically includes a central power supply and a power distribution network. The high frequency performance of a power supply system is typically limited by the distribution network. As illustrated in FIG. 1A, a power distribution line can be viewed as a distributed inductor 15, between a power supply 10 and a peripheral device 20, that opposes transient current changes according to Lenz's law for inductors, V=L(di/dt), where V is a voltage opposing the current change, L is the distributed inductance of the power distribution line, and di/dt is the rate of change of current (i) with respect to time (t). If the frequency of the transient current load on the power supply increases, the rate of change of current increases, and the opposing voltage increases. At sufficiently high operating frequencies, as illustrated in FIG. 1B, the power distribution line may be viewed as a transmission line 16 with a characteristic impedance $Z_0$ and a propagation delay $\Delta t$ that prevents the power supply from responding in-phase with the transient current demands of the processing system. In either case, the transient current demand at the peripheral device 20 in the processing system may exceed the current-sourcing capability of the power supply system, generating voltage spikes which may cause the device to malfunction or which may couple to signal lines and impair signal integrity. In the latter case, loss of signal integrity may manifest as an increase in electromagnetic radiation, which may induce failures in susceptible circuitry of nearby equipment.

One approach to this problem, illustrated in FIG. 1C, is to locate a decoupling capacitor 25 close to the power connections at each device in the processing system, to store charge locally and to supply the transient current demands of the device 20 which cannot be serviced by the remote power supply 10. However, this approach has limitations. Capacitors take up valuable board space, which works against the goal of miniaturization. Furthermore, the stored charge in a capacitor is proportional to voltage (that is, Q=C×V where Q is charge, C is capacitance and V is the system voltage), so as a system operating voltage is reduced, the capacitance (and the area of the capacitors) must be increased to maintain the level of stored charge. As noted above, the reduction of voltage and the increases in frequency tend to increase current demand, so the total capacitance must be increased even more, sacrificing even more board space. As illustrated in FIG. 1D, another way of visualizing the combination of the inductance of a power distribution line and a decoupling capacitor is as a lowpass filter in the frequency domain with a cutoff frequency given approximately by $f_c=1/(LC)^{1/2}$. The power supply system will have difficulty in supplying transient currents with frequencies in the cutoff region above $f_c$, as shown by the cross-hatched region of FIG. 1D. This limitation ultimately defines an operating region where a capacitor network may no longer be effective in supplying energy to an electronic system.

BRIEF DESCRIPTION OF THE DRAWINGS

The present invention is illustrated by way of example, and not of limitation, in the figures of the accompanying drawings in which:

FIG. 5C illustrates a time domain response of the low-pass filter embodiment of FIG. 6A;

FIG. 8A illustrates a frequency distribution of an unmodified control signal in one embodiment of controlling transient current peaks;

FIG. 8B illustrates a frequency distribution of a modified control signal in one embodiment of controlling transient current peaks;

FIG. 9A illustrates a frequency distribution of a transient current load without waveform shaping to control transient current loads.

FIG. 9B illustrates a frequency distribution of a transient current load in the presence of waveform shaping in one embodiment of controlling transient current loads;

DETAILED DESCRIPTION

Figure 1A:
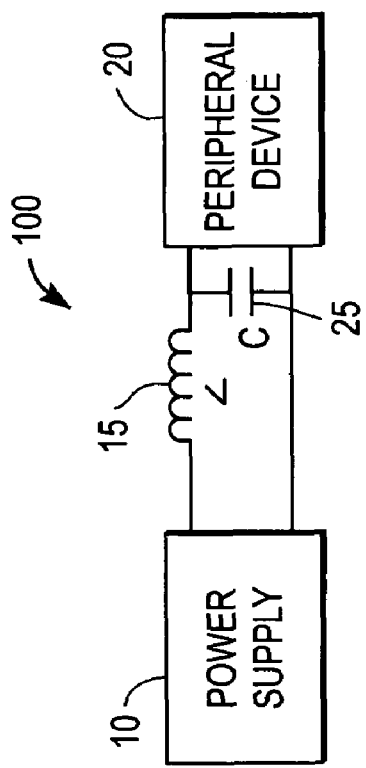
FIG. 1A illustrates a conventional interconnection between a power supply and a device in a processing system as a distributed inductance.
Figure 1B:
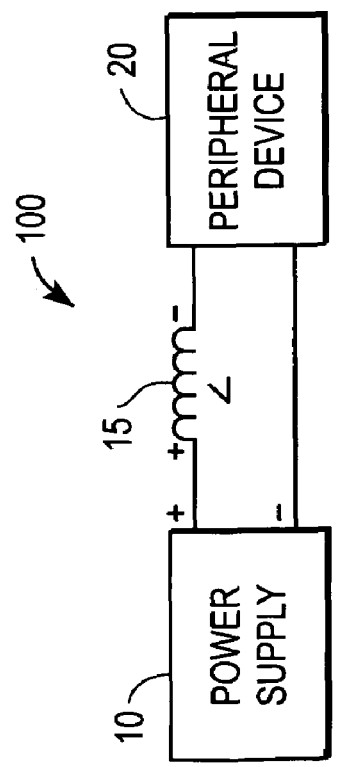
FIG. 1B illustrates a conventional interconnection between a power supply and a device in a processing system as a transmission line.
Figure 1C:
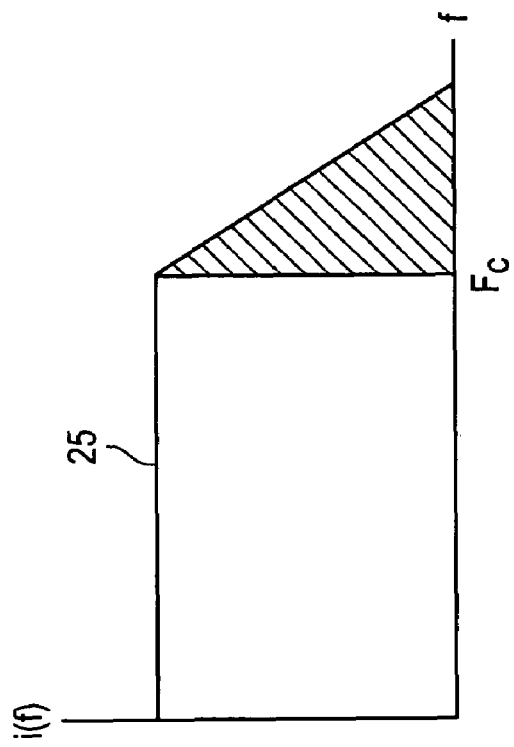
FIG. 1C illustrates the use of decoupling capacitors at a device in a conventional power supply system.
Figure 1D:
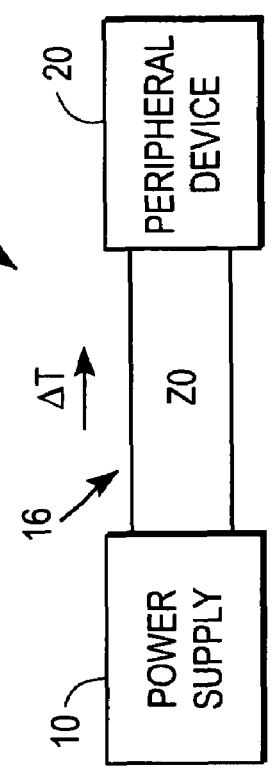
FIG. 1D illustrates the frequency response of a conventional power supply system.

In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention. It should be noted that the "line" or "lines" discussed herein, that connect elements, may be single lines or multiple lines. The term "coupled" as used herein, may mean directly coupled or indirectly coupled through one or more intervening components. It will also be understood by one having ordinary skill in the art that lines and/or other coupling elements may be identified by the nature of the signals they carry (e.g., a "control line" may implicitly carry a "control signal") and that input and output ports may be identified by the nature of the signals they receive or transmit (e.g., a "control input" may implicitly receive a "control signal").

A method and apparatus for controlling transient current peaks is described. In one embodiment, a method includes receiving a control signal having a transition from a first value to a second value over a period of time. The method also includes shaping the control signal by increasing the period of time of the transition to generate a modified control signal. The method also includes applying the modified control signal to a device to reduce a transient current peak in the device. In another embodiment, the method further includes reducing a high-frequency current demand on a power supply system. In yet another embodiment, the method further includes selecting the control signal from a plurality of control signals controlling a device operation having a start time and a stop time, wherein the control signal comprises at least one of a last control signal to define the start time of the operation and a first control signal to define the stop time of the operation.

In another embodiment, a method includes applying a control signal to a device, the control signal having a transition from a first value to a second value over a period of time. The method also includes characterizing a spectral content of a peak transient current of the device and selecting one or more parameters of a waveform shaper to increase the period of the transition, wherein the spectral content of the peak transient current is controlled.

In one embodiment, an apparatus includes a bus interface unit to generate a control signal having a transition from a first value to a second value over a period of time. The apparatus also includes a waveform shaper coupled with the bus interface unit to generate a modified control signal by increasing the period of time of the transition. The apparatus also includes a peripheral device to receive the modified control signal, wherein a transient current peak in the peripheral device is controlled.

Figure 2A:
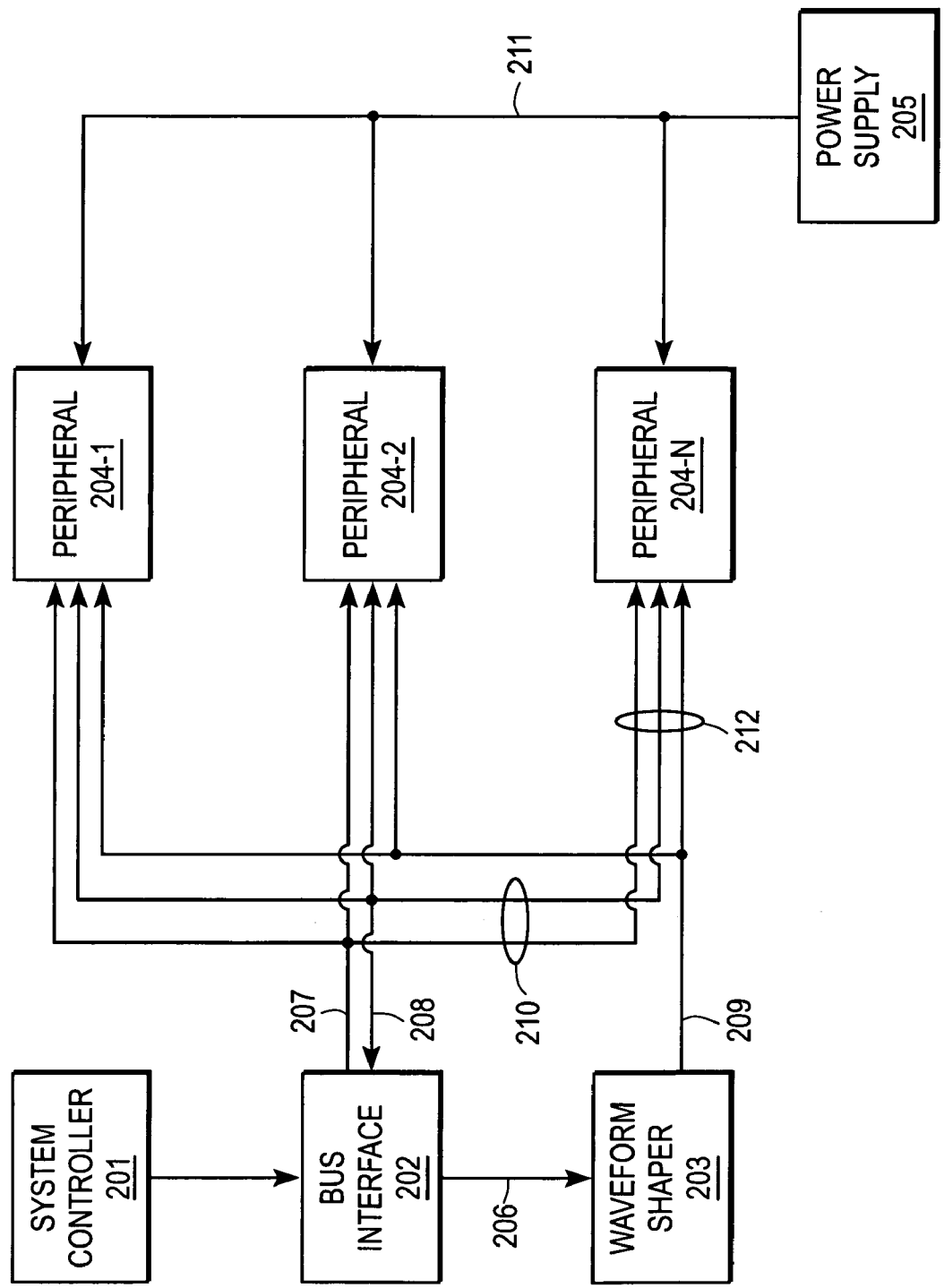
FIG. 2A illustrates one embodiment of a system for controlling transient current peaks.

FIG. 2A illustrates one embodiment of controlling transient current peaks in a processing system 200. Processing system 200 may include system controller 201, which may be a general-purpose processing device such as a microprocessor, microcontroller, central processing unit or the like. Alternatively, system controller 201 may be a special purpose processing device such as an application specific integrated circuit (ASIC), a field-programmable gate array (FPGA), a digital signal processor (DSP) or the like. System controller 201 may also be any combination of a general-purpose processing device and a special-purpose processing device. System controller 201 may be coupled to bus interface unit 202, which may serve as a communications and control interface between system controller 201 and other components of processing system 200. Bus interface unit 202 may buffer all signals that go to the system controller 201 and may generate all signals that go to the system in response to commands from system controller 201 over local bus 212. Bus interface unit 202 may include internal registers (not shown) for storing and buffering configuration and control information. Bus interface unit 202 may be coupled by address lines 207 and data lines 208 to one or more peripherals, such as peripherals 204-1 through 204-n. Peripherals 204-1 through 204-n may be any type of device, component, circuit, subsystem or system capable of communicating with system controller 201 via system bus 212 and bus interface unit 202. For example, peripherals 204-1 through 204-n may include programmable or non-programmable memory devices, input-output devices such as any type of serial or parallel interface, general-purpose processing devices such as microprocessors or controllers, special-purpose devices such as digital signal processors, ASICs, FPGAs, mixed-signal devices and the like.

Bus interface unit 202 may also be coupled to waveform shaper 203 via control lines 206. Bus interface unit 202 may process control data from system controller 201 within its internal registers and may generate control signals and commands to digitally control waveform shaper 203. As described below in greater detail, waveform shaper 203 may modify selected control signals from bus interface unit 202 and apply the modified control signals via control lines 209 to the one or more of peripherals 204-1 through 204-n to control one or more respective transient current peaks in peripherals 204-1 through 204-n. Control signals may include, for example, clock signals, address and data strobe signals, chip enable signals, read enable signals, write enable signals and output enable signals. As illustrated in FIG. 2A, address lines 207 and data lines 208 may form a configuration bus 210 carrying address and data configuration signals. Together, control lines 209 and configuration bus 210 may define a system bus 212.

Processing system 200 may also include power supply 205 to supply operating voltages and currents to peripherals 204-1 through 204-n via power distribution network 211 as shown in FIG. 2A. While not shown in FIG. 2A, power supply 205 may also supply operating voltages and currents to one or more of system controller 201, bus interface unit 202 and waveform shaper 203.

Figure 2B:
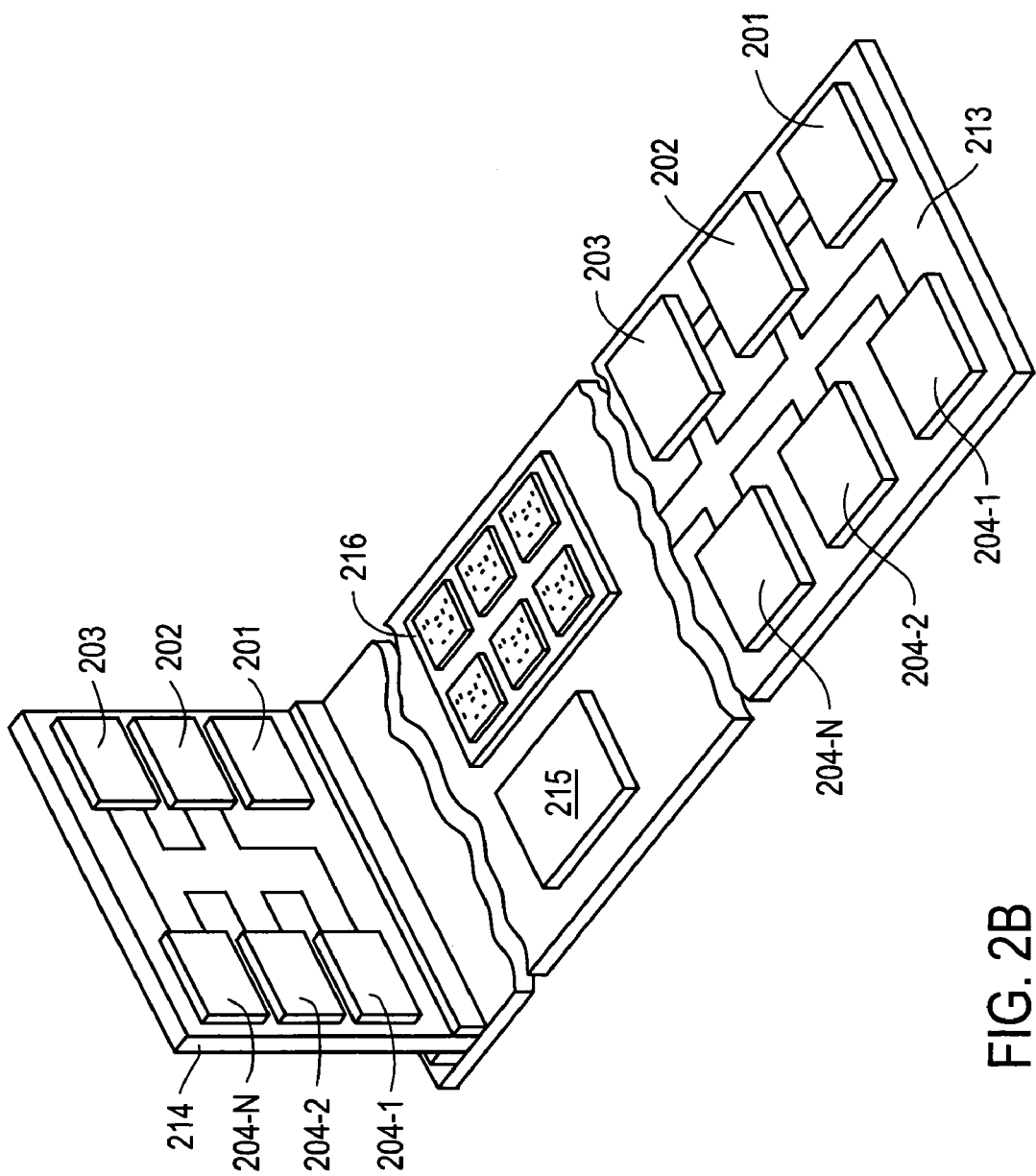
FIG. 2B illustrates one embodiment of a distributed system for controlling transient current peaks.

In other embodiments, two or more of system controller 201, bus interface unit 202, waveform shaper 203 and peripherals 204-1 through 204-n may reside on a common carrier substrate, for example a printed circuit board (PCB) such as a motherboard 213 or a daughter board 214 as illustrated in FIG. 2B. Alternatively, the common carrier substrate on which the two or more of system controller 201, bus interface unit 202, waveform shaper 203 and peripherals 204-1 through 204-n may reside can be a single integrated circuit (IC) die substrate 215 or a multi-chip module 216 including any combination of single chip devices on a common integrated circuit substrate.

Figure 3:
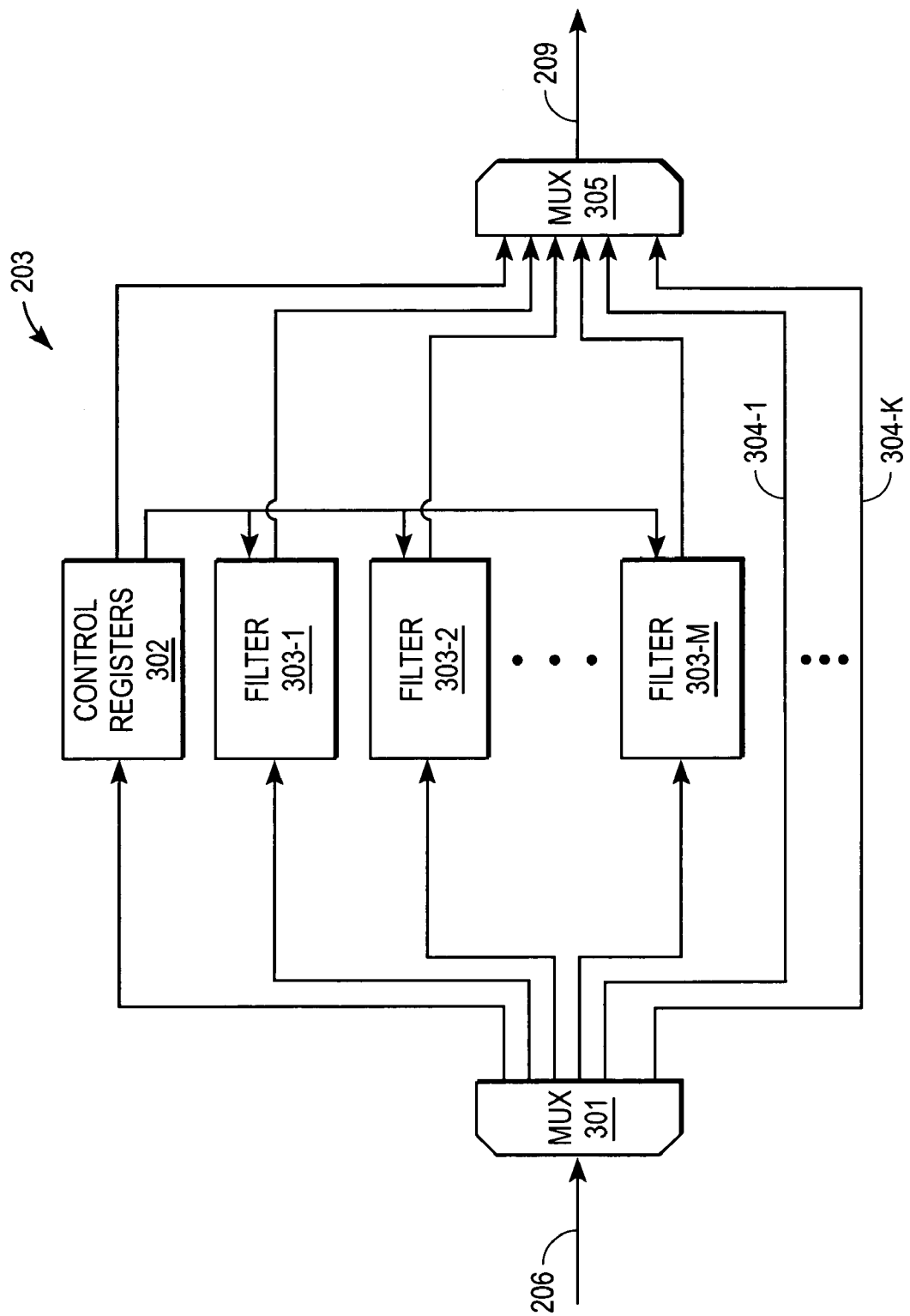
FIG. 3 illustrates one embodiment of a waveform shaper for controlling transient current peaks.

FIG. 3 illustrates one embodiment of waveform shaper 203. At the input of waveform shaper 203, commands and control signals on control lines 206, from bus interface unit 202, may be distributed by a multiplexer (MUX) 301 to control registers 302, one or more filters 303-1 through 303-m, and one or more through lines 304-1 through 304-k. At the output of waveform shaper 203, control signals from the one or more filters 303-1 through 303-m and the one or more through lines 304-1 through 304-k may be switched by a multiplexer (MUX) 305 to control lines 209 for distribution to peripherals 204-1 through 204-n.

Figure 4:
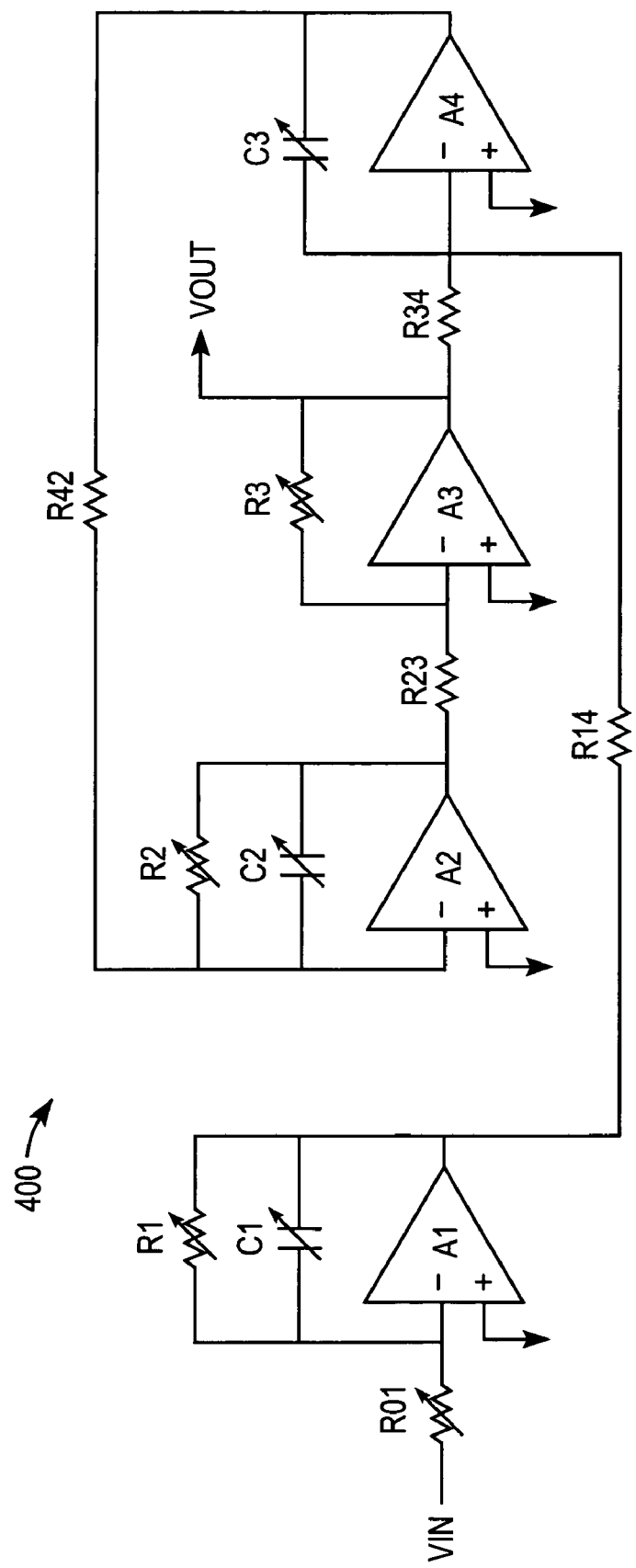
FIG. 4 illustrates a filter topology for waveform shaping in one embodiment of controlling transient current peaks.

Filters 303-1 through 303-m may be programmable lowpass filters. In one embodiment, filters 303-1 through 303-m may be active resistor-capacitor filters with programmable time-constants, such as filter 400 as illustrated in FIG. 4. In FIG. 4, amplifiers A1 through A4 may be high-gain operational amplifiers. Feedback capacitors $C_1$ through $C_3$ may be fixed capacitors or switched capacitors, for example. Coupling resistors $R_{01}$, $R_{23}$, $R_{34}$ and $R_{14}$ and feedback resistors $R_1$, $R_2$, $R_3$ and $R_{42}$ may be fixed resistors, switched resistors or digitally programmable potentiometers, for example. Values stored in control registers 302, by bus interface unit 202, may be used to select values for one or more of feedback capacitors $C_1$ through $C_3$, coupling resistors $R_{01}$, $R_{23}$, $R_{34}$ and $R_{14}$ and feedback resistors $R_1$, $R_2$, $R_3$ and $R_{42}$. The voltage transfer function of filter 400 may be closely approximated by assuming that amplifiers $A_1$ through $A_4$ are ideal operational amplifiers, in which case the voltage transfer function of filter 400 may be expressed by equation (1), where s represents the LaPlace transform variable.

$$V_{out}/V_{in} = \frac{\{(R_1/R_{01})(R_2/R_{42})(R_3/R_{23})}{1-(R_2/R_{42})(R_3/R_{23})[1/(1+sR_2C_2)][1/(sR_{34}C_3)]} \quad (1)$$

The derivation of transfer functions for active RC filters is well known in the art and will not be discussed in detail herein. It will be appreciated that transfer function (1) represents a general third-order lowpass transfer function with pole locations determined by the selection of RC time constants (e.g., $R_2C_2$, $R_{14}C_3$ and $R_{34}C_3$). It will also be appreciated that higher order or lower order filter responses may be obtained by adding or removing active filter stages as is well known in the art. Resistor and capacitor values for filter 400 may be chosen to achieve any of several different well-known transfer function characteristics. For example, transfer function (1) may be any of a maximally flat (Butterworth) transfer function, a constant group delay (Gaussian) transfer function and an equal ripple (Chebychev) transfer function. A common feature of these transfer functions, as described in more detail below, is a monotonic step response which can unambiguously define logic transition levels.

Figure 5A:
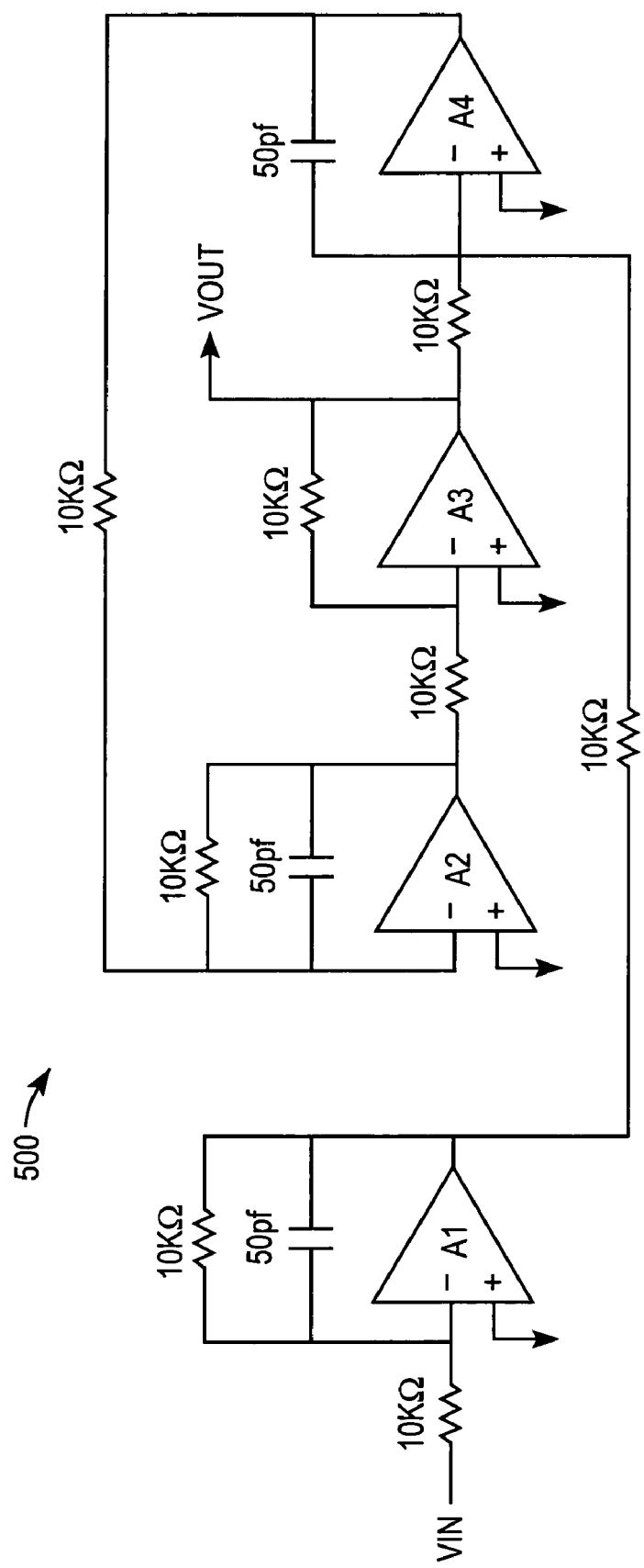
FIG. 5A illustrates one exemplary embodiment of a low-pass filter for controlling transient current peaks.
Figure 5B:
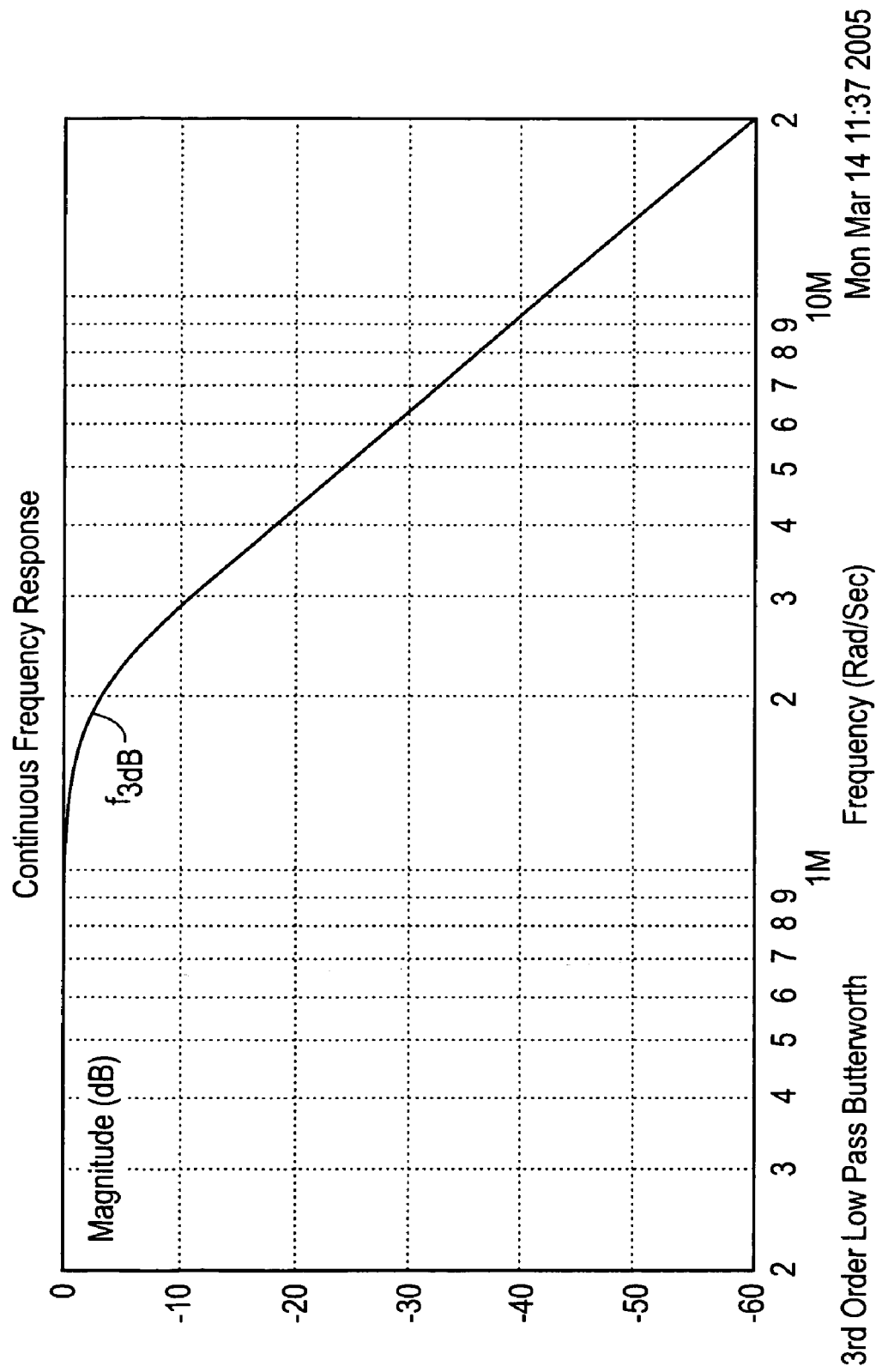
FIG. 5B illustrates a frequency response of the low-pass filter embodiment of FIG. 5A.

FIG. 5A illustrates one embodiment of an exemplary filter 500 with resistor and capacitor values selected to provide a maximally flat third-order response with a 3 dB passband cutoff frequency $f_{3dB}$ of $2 \times 10^6$ radians per second (approximately 318 KHz) and a third-order stopband attenuation slope of −18 dB per octave, corresponding to a third-order response, as shown in FIG. 5B. In other embodiments, resistor and capacitor values may be scaled to achieve higher or lower cutoff frequencies as required by the application.

The time domain response 501 of filter 500 is illustrated in FIG. 5C, which shows the output of filter 500 (normalized to $V_{dd}$=1 volt) in response to a step function (e.g., the leading edge of a square wave) at time t=0. For the resistor and capacitor values selected, this filter provides an output with a 10% to 90% leading-edge rise time $t_r$ of approximately 1.17 microseconds with approximately 10% overshoot and minimal undershoot. The rise time of a lowpass filter in the time domain may be related to the cutoff frequency of the filter in the frequency domain. Here, the rise time of the third-order maximally flat filter may be approximated by $t_r$=0.37/$f_{3dB}$. In the region between the 10% response point and the 90% response point, the transition is monotonic and may be used to switch a logic gate without ambiguity. For example, if the transition point $t_t$ from a logical "0" to a logical "1" is defined as $V_{dd}/2$=0.5 volts, then the transition point $t_t$ is clearly defined by the monotonicity of the transition as shown in FIG. 5C.

Figure 6A:
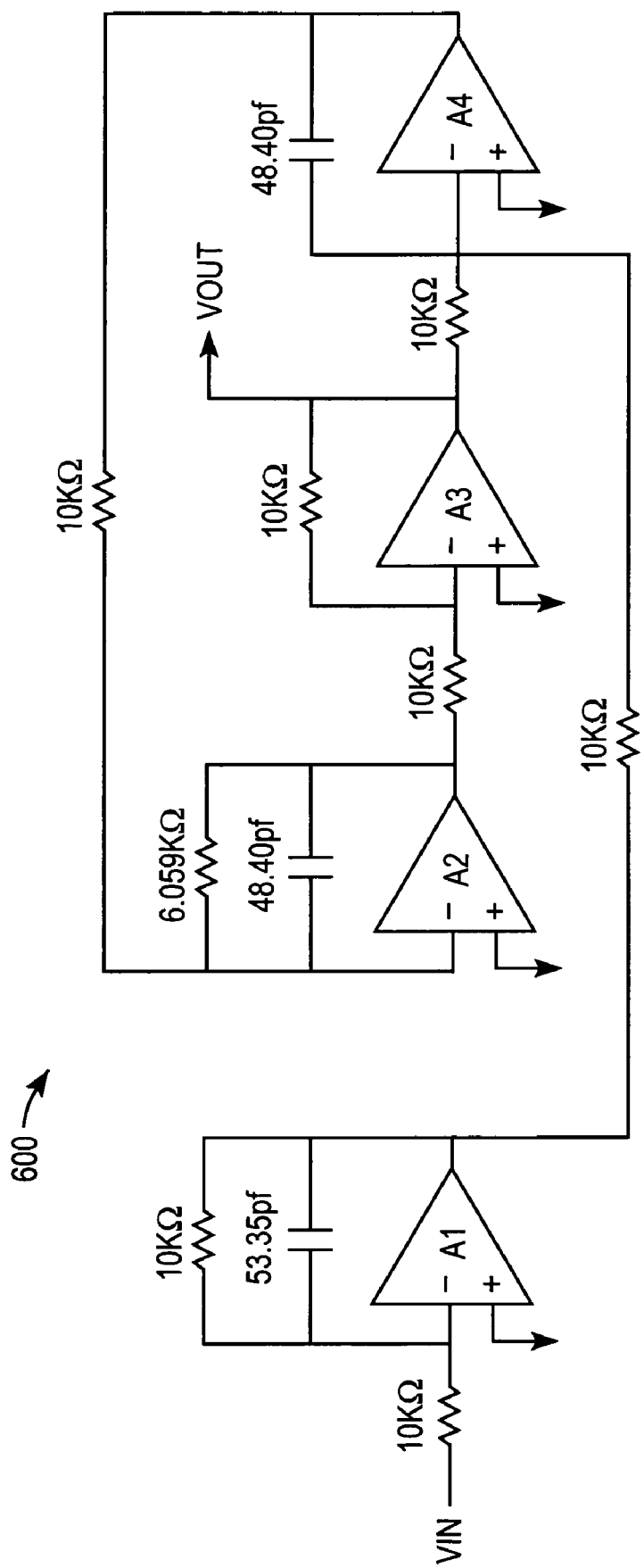
FIG. 6A illustrates another exemplary embodiment of a low-pass filter topology.
Figure 6B:
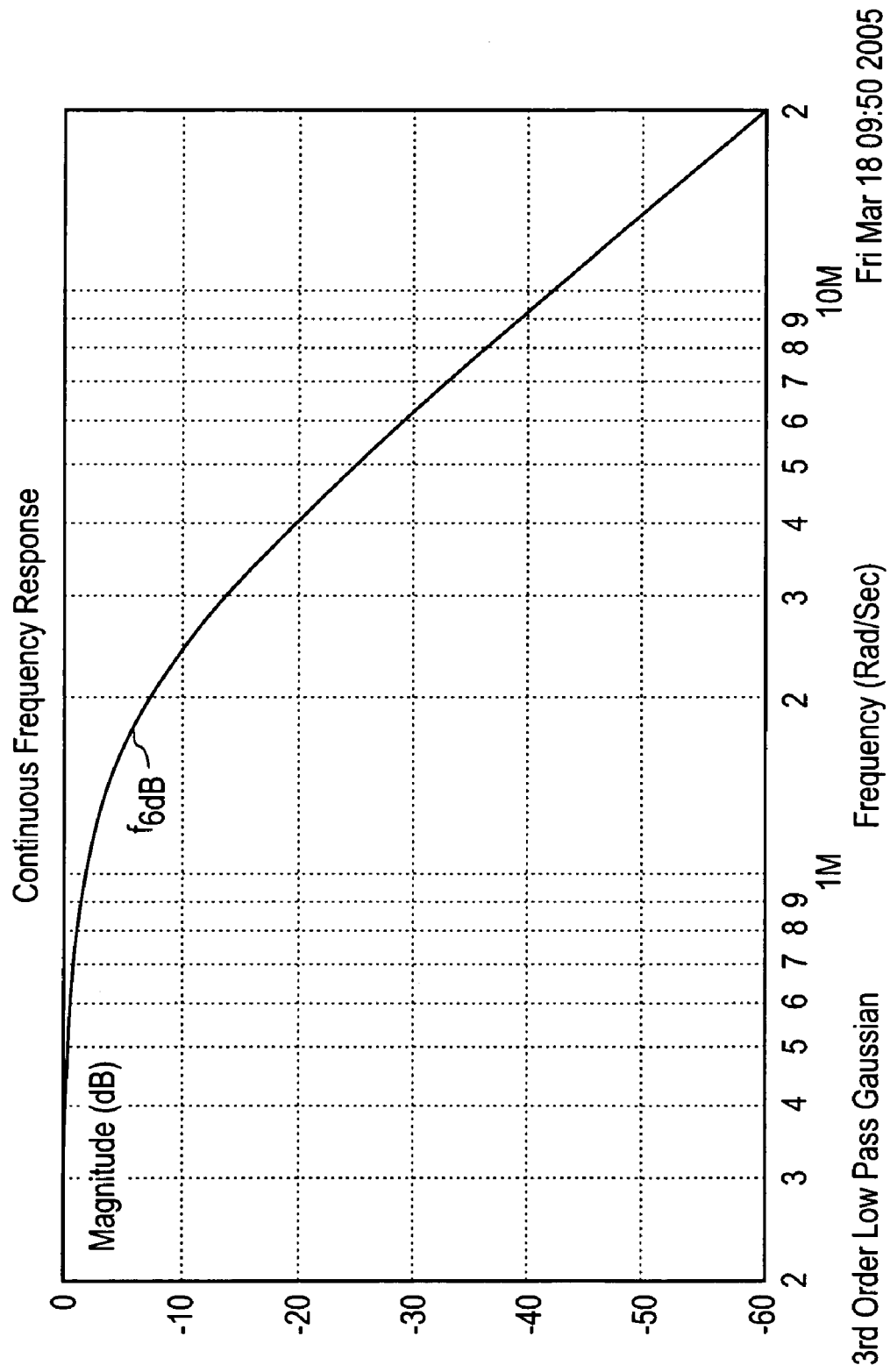
FIG. 6B illustrates a frequency response of the low-pass filter embodiment of FIG. 6A.

FIG. 6a illustrates one embodiment of a filter 600 with resistor and capacitor values selected to provide a third-order Gaussian response with a nominal 6 dB cutoff frequency of $2 \times 10^6$ radians per second and a third-order stopband attenuation slope of −18 dB per octave as shown in FIG. 6B. A Gaussian response filter exhibits constant group delay versus frequency and yields a well-behaved response in the time domain, with little or no overshoot.

Figure 6C:
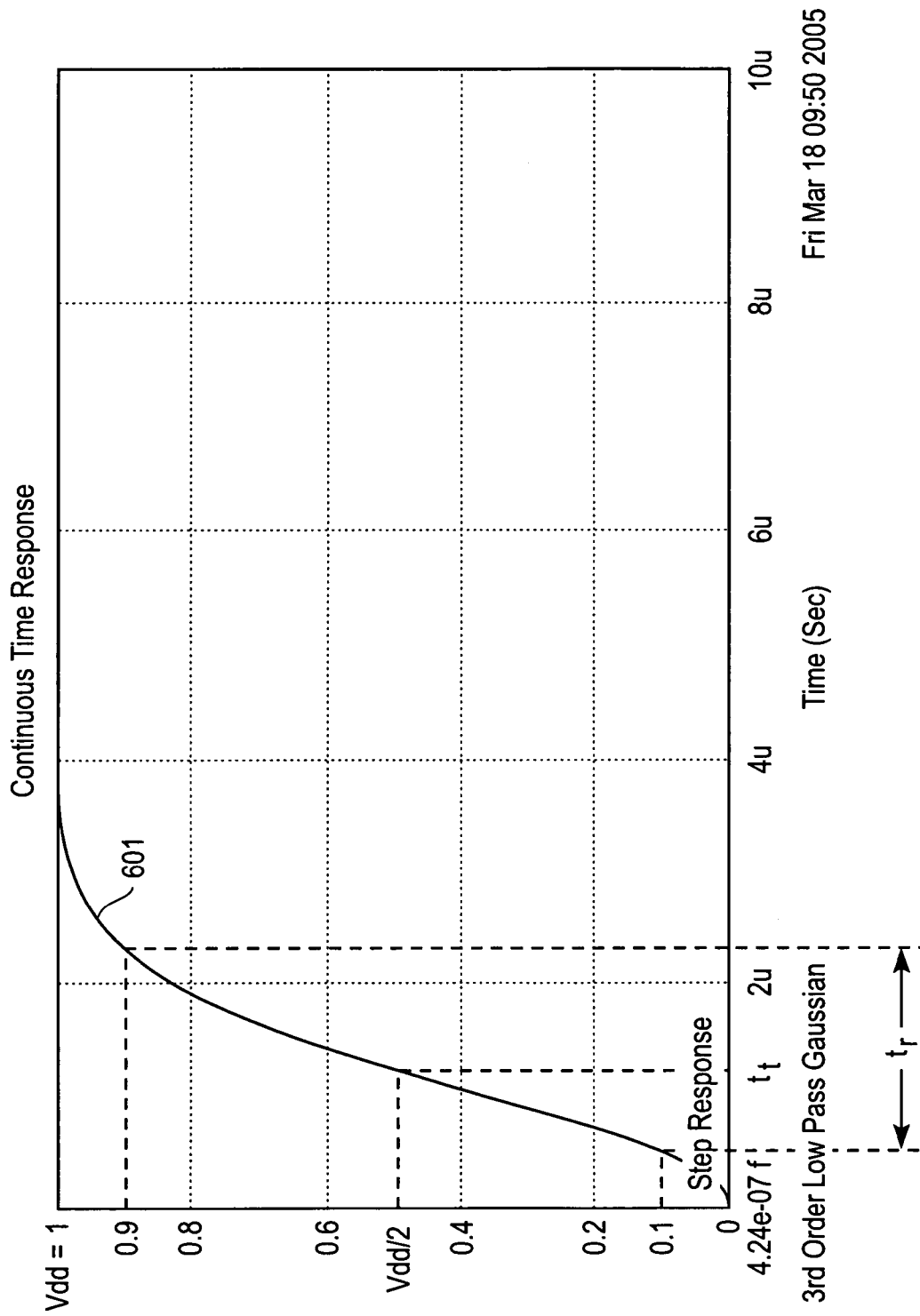
FIG. 6C illustrates a time domain response of the low-pass filter embodiment of FIG. 6A.

The time domain response 601 of filter 600 is illustrated in FIG. 6C, which shows the output of filter 600 (normalized to $V_{dd}$=1 volt) in response to a step function at time t=0. For the resistor and capacitor values selected, this filter provides an output with a 10% to 90% leading-edge rise time $t_r$ of approximately 1.75 microseconds and no overshoot. As above, the rise time may be related to the design cutoff frequency. Here, the rise time of the third-order Gaussian filter may be approximated by $t_r$=0.56/$f_{6\,dB}$. And again, in the region between the 10% response point and the 90% response point, the transition is monotonic and may be used to clearly define a logic transition level such as Vdd/2=0.5 volts as shown in FIG. 6C.

Figure 6D:
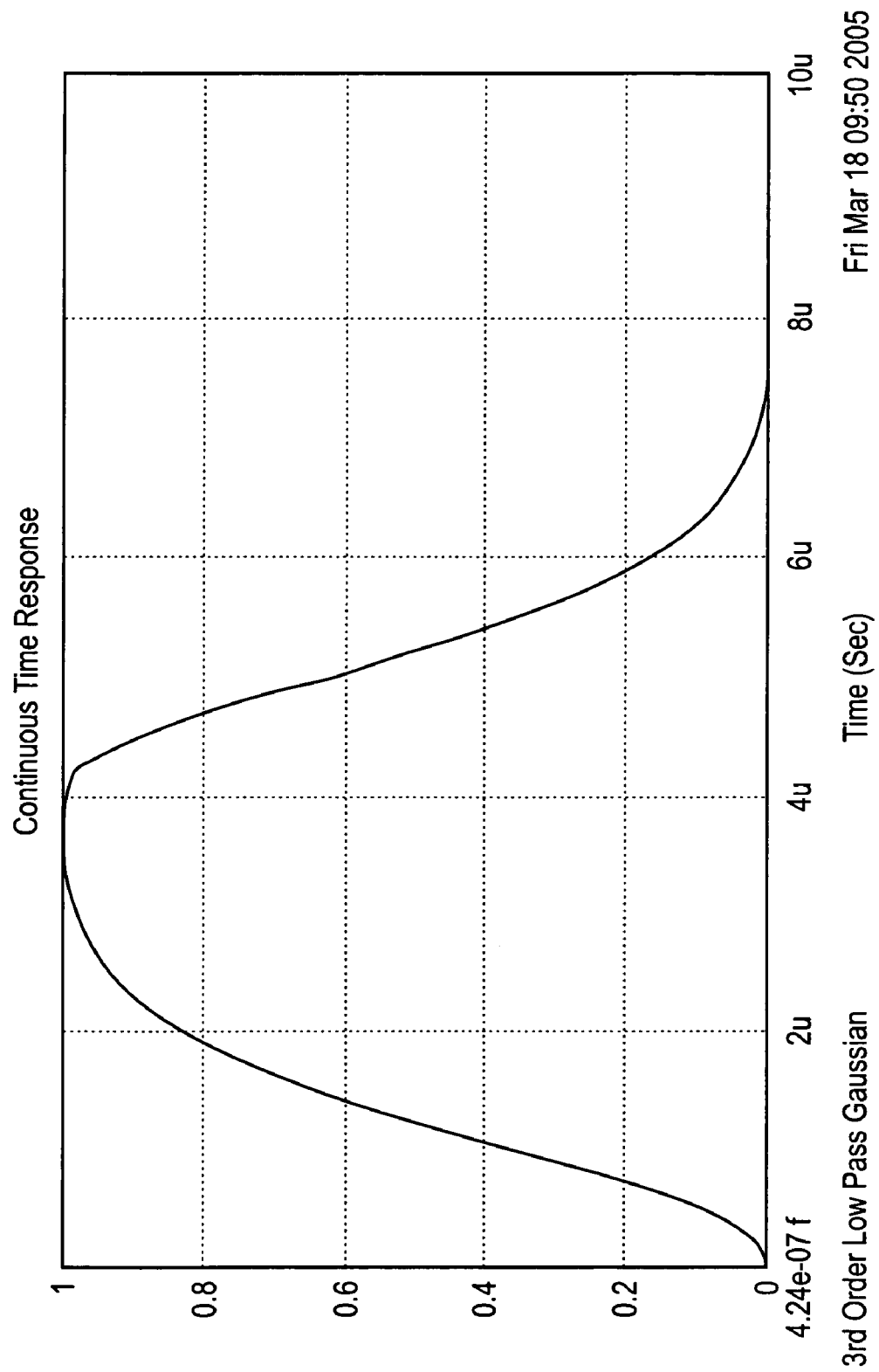
FIG. 6D illustrates a pulse response of the low-pass filter embodiment of FIG. 6A.

FIG. 6D illustrates the pulse response 602 of filter 600 to an exemplary 4-microsecond input pulse which may be, for example, an asynchronous control signal on one of control lines 206 at the input to waveform shaper 203. As illustrated in FIG. 6D, the trailing edge of pulse response 602 is also monotonic and may be used to unambiguously define a logic transition level as described above with respect to the leading edge response of filter 600.

Figure 7A:
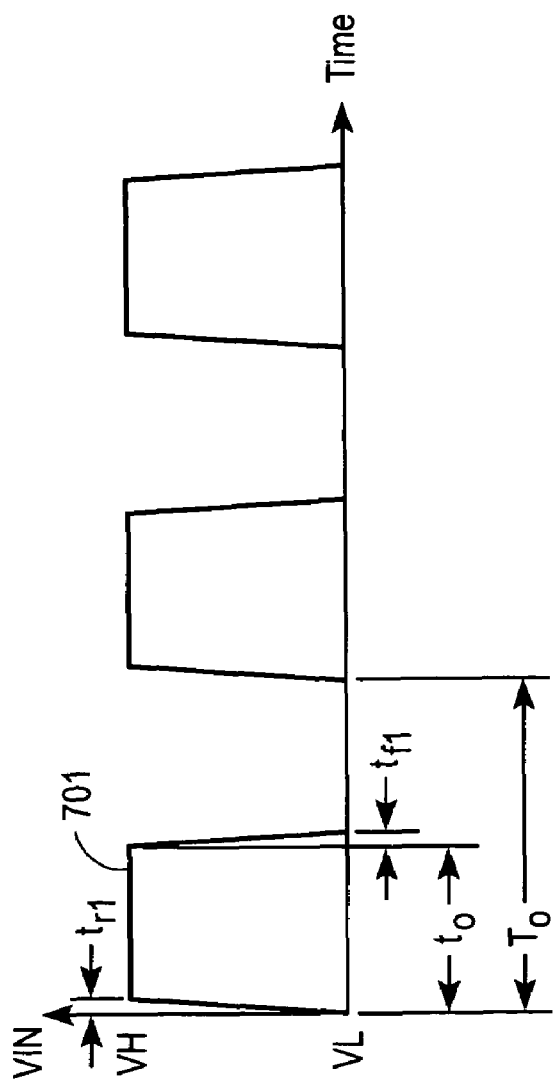
FIG. 7A illustrates an unmodified control signal in one embodiment of controlling transient current peaks.
Figure 7B:
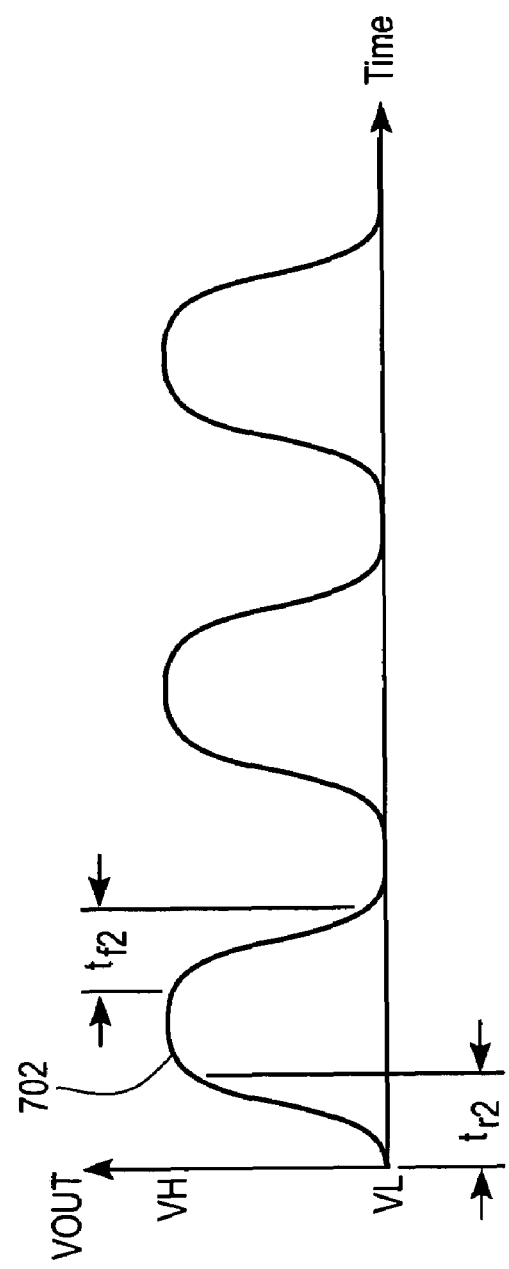
FIG. 7B illustrates a modified control signal in one embodiment of controlling transient current peaks.

FIG. 7A illustrates a periodic control signal 701 in the time domain, on one of control lines 206, that transitions between a first value $V_L$ and a second value $V_H$ at the input to waveform shaper 203 in a period of time $t_{r1}$, and between $V_H$ and $V_L$ in a period of time $t_{f1}$. FIG. 7B illustrates the modified periodic control signal 702 on one of the control lines 209 at the output of waveform shaper 203 for the case of the Gaussian filter illustrated in FIG. 6, where the period of time to transition between $V_L$ and $V_H$ has been increased to $t_{r2}$ and the period of time to transition between VH and VL has been increased to $t_{f2}$.

The time domain waveform 701 of FIG. 7A may be represented in the frequency domain by a discrete Fourier transform 801 as shown in FIG. 8A, where $f_0=1/T_0$ where the amplitudes of each frequency component will depend analytically on the ratio of pulse with $t_0$ to period $T_0$ and on the values of $t_{r1}$ and $t_{f1}$. It will also be appreciated that the discrete Fourier transform 802 of the modified time domain waveform 702 of FIG. 7B may be obtained by the superposition of the Fourier transform 801 and the continuous frequency response of the Gaussian filter 600 as illustrated in FIG. 6C. That is, the frequency content of the modified control signal 702 may be obtained by multiplying the discrete spectrum of FIG. 8A with the continuous spectrum of FIG. 6C, such that the lowpass response of filter 600 will be superimposed on the spectral content of control signal 701, reducing the high frequency content of control signal 701.

As described above, a modified control signal, such as a periodic (e.g., synchronous) control signal 702 or an asynchronous control signal 602, may be used to control one or more logic gates in one or more of peripherals 204-1 through 204-n. Logic gates may exhibit many different transfer functions from their input control voltages, such as control voltage 702, and their output (e.g., drain) currents. For example, a logic gate may have a linear transfer function, a quadratic transfer function or some more complex transfer function. However, for a given transfer function from the input of the logic gate (or gates) to the output of the logic gate (or gates), if a spectral component of the input is reduced, the corresponding spectral component of the output will be reduced.

FIG. 9A illustrates the current demand of a peripheral device without control signal shaping. In FIG. 9A, spectrum 901 is a normalized spectrum of the current demand of a peripheral device, such as peripheral 204-1, when the device is controlled by control signal, such as control signal 701 via through-path 304-1 of waveform generator 203. FIG. 9B illustrates the current demand of a peripheral device with control signal shaping. In FIG. 9B, spectrum 902 is a normalized spectrum of the current demand of the same peripheral device when the device is controlled by a modified control signal, such as control signal 702, generated by passing control signal 701 through, for example, a filter 303-1 configured to have the response of filter 600. A figure of merit for control signal shaping may be defined as the difference between spectrums, with and without control signal shaping, at a critical frequency $f_{crit}$. For example, as shown in FIGS. 9A and 9B, if the critical frequency is selected as $0.5 \times 10^9$ Hz, then the figure of merit would be approximately 15 dB.

The critical frequency and figure of merit of may be selected by selecting values of feedback capacitors and resistors in filter 400 as described above. If $f_{crit}$ is selected to be less than the cutoff frequency $f_c$ of a power supply system, such as conventional power supply system 100 described above, then the high frequency current capacity of the power supply system will not be exceeded, thereby reducing high-frequency voltage spikes on the distribution lines of the power supply system do to current starving.

Figure 10:
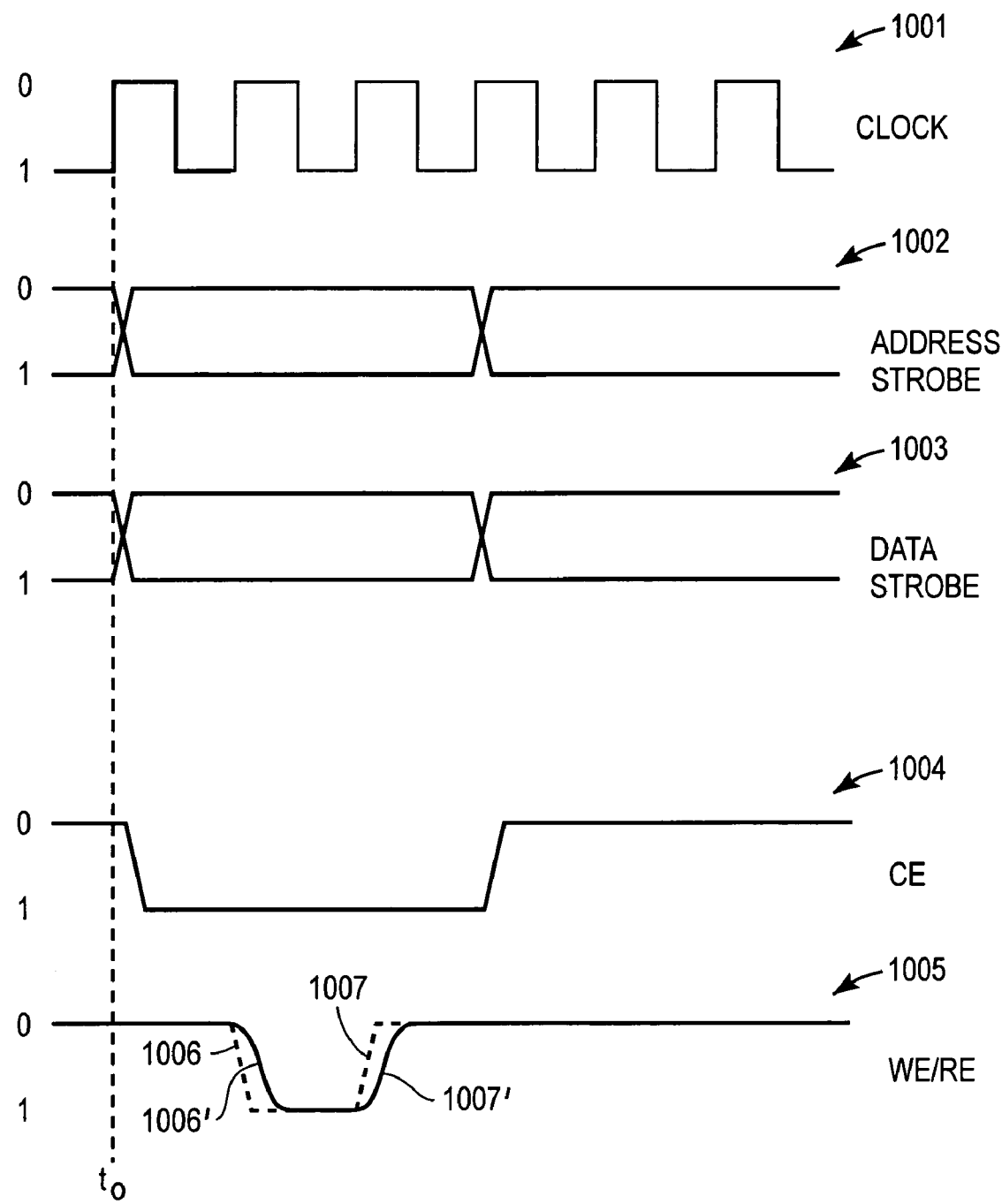
FIG. 10 illustrates a control signal priority in one embodiment of controlling transient current loads.

While unmodified control signals in a processing system may generate high-frequency transient currents as a result of their high edge-rates, as described above, not all control signals may have an equal effect on transient current peaks. Control signal of particular interest may be those control signals that define the start or stop of an operation, in contrast to control signals that only set up the conditions for the operation. FIG. 10 is a timing diagram of an exemplary write operation in a peripheral memory device (e.g., one of peripheral device 204-1 through 204-n), illustrating one embodiment of control of transient current peaks. FIG. 10 is used to illustrate either a synchronous system or an asynchronous system. In a synchronous system, all signals may be timed off of a clock signal, such as clock signal 1001. In an asynchronous system, the timing of signals may be controlled by combinatorial logic as is well-known in the art. In either case, the write operation may require that several control signals combine to satisfy a particular timing constraint.

For example, in the write operation illustrated in FIG. 10, where signals are defined as active low for convenience, an address strobe signal 1002, a data strobe signal 1003, and a chip enable signal 1004 must all be active before the write enable signal 1005 is valid. It is the leading edge 1006 of write enable signal 1005, the last signal in the start of the write sequence, which actually marks the start of the write operation and initiates the transient current peak associated with the start of the write operation. Conversely, it is the trailing edge 1007 of write enable signal 1005, the first signal that marks the end of the write operation, which initiates the transient current peak associated with the termination of the write operation and which then releases the address strobe 1002, the data strobe 1003 and the chip enable 1004. In a read operation, the write enable signal may be replaced with a read enable signal as shown in FIG. 10.

In general, a control signal (such as control signal 1005) which is the last signal in a sequence that defines the start an operation, and/or the first signal in a sequence that defines the end of an operation, may be considered a critical or priority control signal with respect to the generation of high frequency transient current peaks. Such a control signal may be selected for filtering by waveform shaper 203 to produce a modified control signal with a leading edge (such as leading edge 1006') and a trailing edge (such as trailing edge 1007') that transition from one logic level to another logic level over a period of time that is greater than the transition time of the unmodified control signal.

Figure 11:
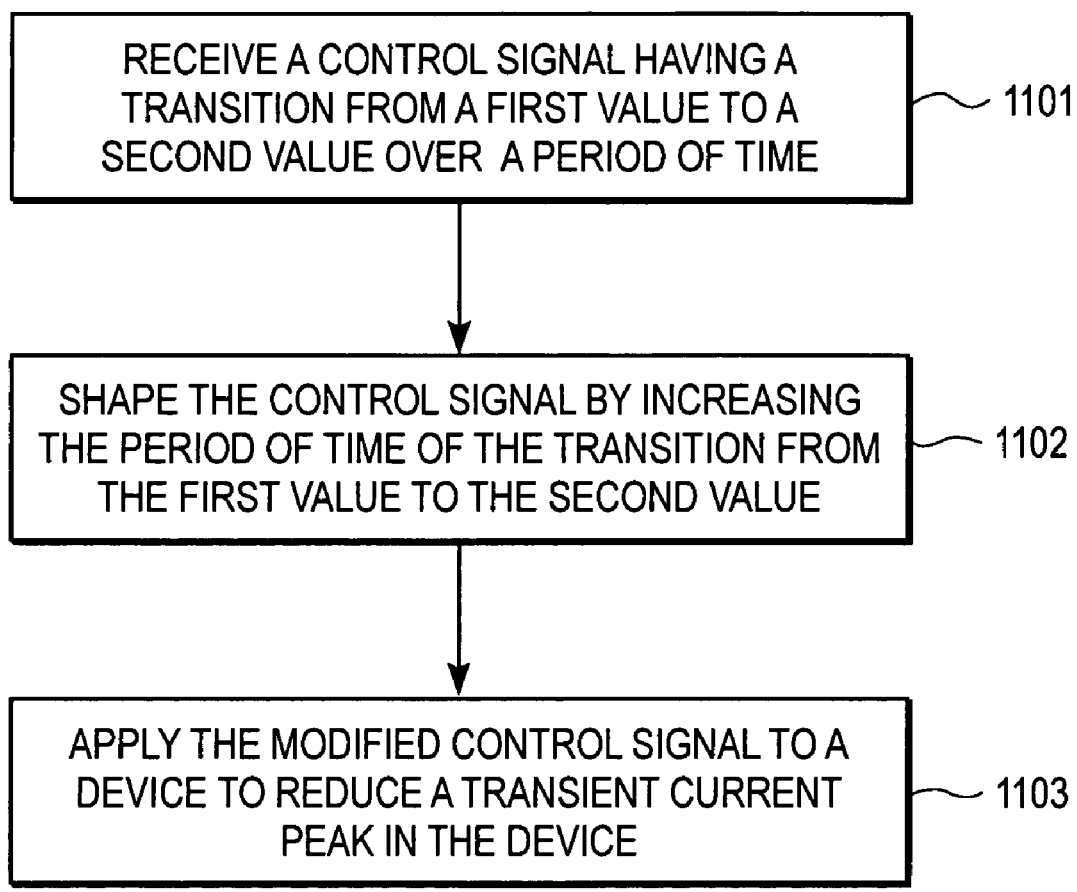
FIG. 11 illustrates one embodiment of a method for controlling transient current loads.

With reference to FIG. 7, FIG. 11 illustrates one embodiment of a method for controlling transient current peaks. In the exemplary embodiment, a waveform shaper, such as waveform shaper 203, receives a control signal, such as control signal 701 for example, having transitions between a first value and a second value over a period of time, such as rise time $t_{r1}$ and fall time $t_{f1}$ (step 1101). The waveform shaper 203 shapes the control signal 701 by increasing the period of time of the transition, such as rise time $t_{r2}$ and fall time $t_{f2}$, to generate a modified control signal such as modified control signal 702 (step 1102). The modified control signal 702 is applied to a device, such as one of peripheral devices 204-1 through 204-n, to reduce a transient current peak in the device (step 1103).

Figure 12:
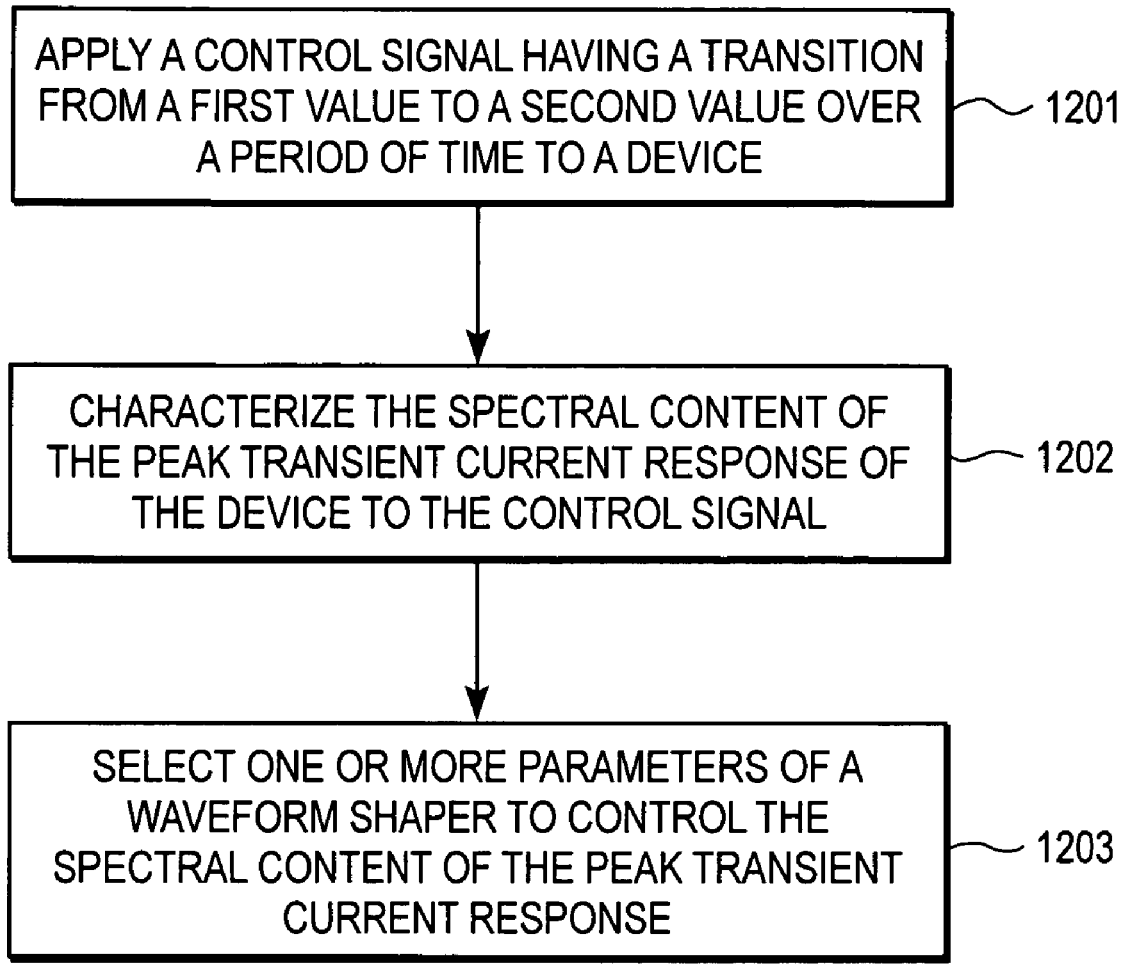
FIG. 12 illustrates one embodiment of a method for adapting a control signal for controlling transient current loads.

Waveform shaper 203 may be part of a discrete or integrated system, such as the system illustrated in FIG. 2A and/or FIG. 2B. In such a system, waveform shaper 203 may be programmed during manufacture to adapt selected control signals from bus interface unit 202 to selected peripherals such as peripherals 204-1 through 204-n. With reference to FIG. 7, FIG. 12 illustrates one embodiment of a method for adapting a control signal to a device for controlling transient current peaks. In one operation, a control signal, such as control signal 701, having transitions between a first value and a second value over periods of time such as $t_{r1}$ and $t_{f1}$, is applied to a device such as one of peripheral devices 204-1 through 204-n (step 1201). In another operation, the spectral content of the peak transient current of the peripheral device, such as spectral content 901, is characterized (step 1202). In another operation, one or more parameters of the waveform shaper 203 is selected (e.g., time constants of one or more filters 303-1 through 303-m) to increase the periods of the transition between the two values, to $t_{r2}$ and $t_{f2}$ for example, to control the spectral content of the peak transient current in the device, step 1203.

Accordingly, embodiments of the invention enable the control of transient current peaks. It should be appreciated that references throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. A method, comprising:
    receiving a control signal having a transition from a first value to a second value over a period of time;
    selecting the control signal from a plurality of control signals controlling a device operation having a start time and a stop time, wherein the control signal comprises at least one of a last control signal to define the start time of the operation and a first control signal to define the stop time of the operation;
    shaping the control signal by increasing the period of time of the transition to generate a modified control signal; and
    applying the modified control signal to the device to reduce a peak value of a transient switching current in the device.

2. The method of claim 1, wherein shaping the control signal comprises low-pass filtering the control signal, wherein the transition from the first value to the second value is monotonic.

3. The method of claim 1, wherein applying the modified control signal to the device comprises switching the device with the modified control signal.

4. The method of claim 1, wherein the control signal is received from a bus interface unit.

5. The method of claim 1, wherein the control signal comprises a synchronous signal.

6. The method of claim 5, wherein the synchronous signal comprises one of a clock signal, a chip enable signal, a write enable signal, a read enable signal, an address strobe signal and a data strobe signal.

7. The method of claim 1, wherein the control signal comprises an asynchronous signal.

8. The method of claim 7, wherein the asynchronous signal comprises one of a chip-enable signal, a write-enable signal, a read-enable signal, an address strobe signal and a data strobe signal.

9. The method of claim 1, wherein shaping the control signal comprises increasing at least one of a rise time of a leading edge of the control signal and a fall time of a trailing edge of the control signal.

10. The method of claim 1, wherein shaping the control signal comprises removing high frequency components of the control signal.

11. The method of claim 1, wherein applying the modified control signal to the device comprises applying the modified control signal to a logic gate in the device, wherein the transient switching current in the device is controlled by the modified control signal.

12. A system, comprising:
    a bus interface unit to select a control signal from a plurality of control signals controlling a device operation, the operation having a start time and a stop time, wherein the control signal comprises at least one of a last control signal to define the start time of the operation and a first control signal to define the stop time of the operation, the control signal having a transition from a first value to a second value over a period of time;
    a waveform shaper coupled with the bus interface unit to generate a modified control signal by increasing the period of time of the transition; and
    a peripheral device to receive the modified control signal, wherein the modified control signal is configured to reduce a peak value of a transient switching current in the peripheral device.

13. The system of claim 12, wherein the waveform shaper comprises a programmable low-pass filter.

14. The system of claim 13, wherein the programmable low-pass filter comprises an active filter having one or more programmable time-constants.

15. The system of claim 14, wherein the programmable time constants comprise one or more resistor-capacitor (RC) time-constants and the programmable low-pass filter includes one or more programmable resistors.

16. The system of claim 15, wherein the programmable resistors comprise one or more digitally programmable potentiometers, wherein the waveform shaper further comprises a plurality of registers to receive control values to program the one or more digitally programmable potentiometers.

17. The system of claim 16, wherein the programmable resistors comprise one or more arrays of digitally switched resistors, wherein the waveform shaper further comprises a plurality of registers to receive control values to select values of the one or more digitally switched resistors.

18. The system of claim 14, wherein the programmable time constants comprise one or more resistor-capacitor (RC) time-constants and the programmable low-pass filter includes one or more programmable capacitors.

19. The system of claim 16, wherein the programmable capacitors comprise one or more arrays of digitally switched capacitors, wherein the waveform shaper further comprises a plurality of registers to receive control values to select values of the one or more digitally switched capacitors.

20. The system of claim 12, wherein the peripheral device comprises a memory device.

21. The system of claim 12, wherein the peripheral device comprises an input-output device.

22. The system of claim 12, wherein the peripheral device comprises a programmable logic device.

* * * * *

UNITED STATES PATENT AND TRADEMARK OFFICE
CERTIFICATE OF CORRECTION

| | |
|---|---|
| PATENT NO. | : 7,312,646 B2 |
| APPLICATION NO. | : 11/128631 |
| DATED | : December 25, 2007 |
| INVENTOR(S) | : Joel A. Jorgenson et al. |

It is certified that error appears in the above-identified patent and that said Letters Patent is hereby corrected as shown below:

On the title page item (75), please insert --Michael J. Schmitz-- as the fourth inventor.

Signed and Sealed this

Twenty Second Day of April, 2008

JON W. DUDAS
*Director of the United States Patent and Trademark Office*